United States Patent
Lambert et al.

(10) Patent No.: US 11,416,353 B2
(45) Date of Patent: Aug. 16, 2022

(54) DIMM VOLTAGE REGULATOR SOFT START-UP FOR POWER FAULT DETECTION

(71) Applicant: DELL PRODUCTS, LP, Round Rock, TX (US)

(72) Inventors: Timothy M. Lambert, Austin, TX (US); Jordan Chin, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 475 days.

(21) Appl. No.: 16/569,740

(22) Filed: Sep. 13, 2019

(65) Prior Publication Data

US 2021/0081286 A1    Mar. 18, 2021

(51) Int. Cl.
| | |
|---|---|
| G11C 5/14 | (2006.01) |
| G06F 11/20 | (2006.01) |
| G06F 13/16 | (2006.01) |
| G06F 13/42 | (2006.01) |
| G11C 11/4074 | (2006.01) |
| G06F 1/28 | (2006.01) |
| G11C 11/4072 | (2006.01) |
| G11C 11/4093 | (2006.01) |

(52) U.S. Cl.
CPC ............ *G06F 11/2015* (2013.01); *G06F 1/28* (2013.01); *G06F 13/1668* (2013.01); *G06F 13/4282* (2013.01); *G11C 11/4072* (2013.01); *G11C 11/4074* (2013.01); *G06F 2201/805* (2013.01); *G06F 2213/0016* (2013.01); *G11C 11/4093* (2013.01)

(58) Field of Classification Search
CPC .... G06F 11/2015; G06F 1/28; G06F 13/1668; G06F 13/4282; G06F 2201/805; G06F 2213/0016; G11C 11/4072; G11C 11/4074
USPC .......................................................... 365/226
See application file for complete search history.

(56) References Cited

U.S. PATENT DOCUMENTS

| 8,045,328 B1 * | 10/2011 | Chen .................. H05K 7/20727 |
|---|---|---|
| | | 361/679.48 |
| 10,262,730 B1 | 3/2019 | Gopalan et al. |
| 10,269,408 B2 | 4/2019 | Gopalan et al. |

(Continued)

FOREIGN PATENT DOCUMENTS

| WO | WO-2019052461 A * | 3/2019 | ............... G06F 1/30 |

*Primary Examiner* — Viet Q Nguyen
(74) *Attorney, Agent, or Firm* — Larson Newman, LLP

(57) ABSTRACT

An information handling system includes a memory device having a voltage regulator enabled by a command from a processor. The memory device provides an indication to a logic device that the voltage regulator successfully powered up the memory device. A failure to provide the indication within a time duration indicates that the voltage regulator failed to successfully power up the memory device. The logic device determines that the processor issued the first command, sends a second indication to the processor indicating that the first voltage regulator successfully powered up the first memory device when the first indication is received within the first time duration after determining that the processor issued the first command, and sends a third indication to the processor that the first voltage regulator failed to successfully power up the first memory device when the first indication is not received within the first time duration after determining that the processor issued the first command.

20 Claims, 6 Drawing Sheets

(56) References Cited

U.S. PATENT DOCUMENTS

| | | | |
|---|---|---|---|
| 10,916,326 B1 * | 2/2021 | Holmberg, Jr. | G06F 11/073 |
| 2017/0344498 A1 | 11/2017 | Voor et al. | |
| 2018/0309321 A1 | 10/2018 | Montero et al. | |
| 2019/0004847 A1 | 1/2019 | Yang et al. | |

* cited by examiner

DIMM VOLTAGE REGULATOR SOFT START-UP FOR POWER FAULT DETECTION

FIELD OF THE DISCLOSURE

The present disclosure generally relates to information handling systems, and more particularly relates to a Dual In-Line Memory Module voltage regulator soft start-up for power fault detection.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system may include a memory device having a voltage regulator enabled by a command from a processor. The memory device may provide an indication to a logic device that the voltage regulator successfully powered up the memory device. A failure to provide the indication within a time duration may indicate that the voltage regulator failed to successfully power up the memory device. The logic device may determine that the processor issued a first command, send a second indication to the processor indicating that the first voltage regulator successfully powered up the first memory device when the first indication is received within the first time duration after determining that the processor issued the first command, and send a third indication to the processor that the first voltage regulator failed to successfully power up the first memory device when the first indication is not received within the first time duration after determining that the processor issued the first command.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
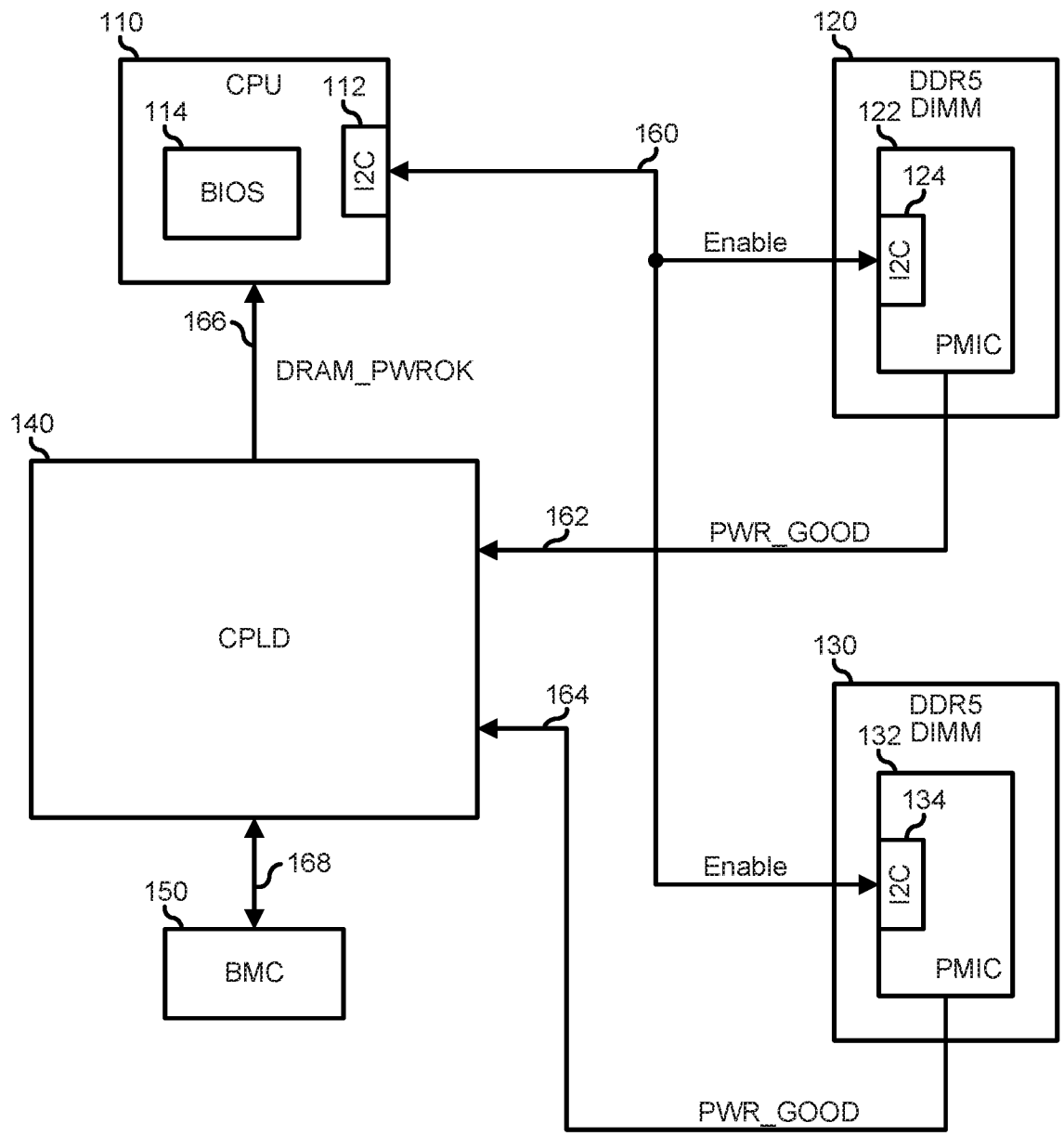
FIG. 1 is a block diagram of an information handling system according to an embodiment of the present disclosure.

FIG. 1 illustrates an information handling system 100, including a CPU 110, Dual Data Rate 5 (DDR5) Dual In-Line Memory Modules (DIMMs) 120 and 130, a complex programmable logic device (CPLD) 140, and a Baseboard Management Controller (BMC) 150. CPU 110 includes an Inter-Integrated Circuit (I2C) interface 112 and operates to execute code to implement a Basic Input/Output System/Universal Extensible Firmware Interface (BIOS) 114. DIMMs 120 and 130 include respective power management integrated circuits (PMICs) 122 and 132. PMICs 122 and 132 include respective I2C interfaces 124 and 134. In a particular embodiment, I2C interface 112 operates as an I2C bus master and I2C interfaces 124 and 134 operate as I2C bus slaves, such that CPU 110 can send I2C commands to PMICs 122 and 132, and the PMICs can respond to the commands from the CPU. It will be understood that one or more of I2C interfaces 112, 124, and 134 may operate as I2C bus master/slaves, as needed or desired. It will be understood that information handling system 100 may include one or more additional DDR5 DIMMs as needed or desired. It will be further understood that, where CPU 110 and DIMMs 120 and 130 each include respective I2C interfaces 112, 124, and 134, the present disclosure broadly relates to side-band communications between processors, baseboard management controllers, and memory devices, and that the specific side-band communication interface can include other interfaces than the I2C interface illustrated herein. In particular, it will be understood that the side-band interface as specified for DDR5 DIMMs may include an interface that is in compliance with the MIPI Alliance Improved Inter-Integrated Circuit (I3C) specification. Moreover, the present disclosure is not limited to communications with memory devices only, but relates more broadly to side-band communications between other devices with integrated or on-board power management devices similar to the PMIC devices illustrated on the DDR5 DIMMs herein, and that thus other side-band interfaces are contemplated herein, as needed or desired.

In previous generations of DDR memory (e.g., DDR3, DDR4), the DDR DIMMs received conditioned power rails from the main printed circuit board (PCB) into which the DDR DIMMs were installed. As such, the main PCB would include voltage regulators to convert main and auxiliary power voltages, typically 12 V and 5 V, into the voltage levels needed by the DIMMs, typically 2.5 V, 1.8 V, 1.2 V, and variously specified data signaling voltage levels. Here, a power up sequence for previous generations of DDR memory would consist of providing the main and auxiliary power voltages to the various voltage regulators as soon as the main and auxiliary power rails become energized, and ensuring that the various DIMM voltage rails become energized simultaneously, in order to prevent lock-up of the memory device on the DIMMs. It will be understood that variations in the details may be needed for the different previous generations of DDR memory.

Figure 2:
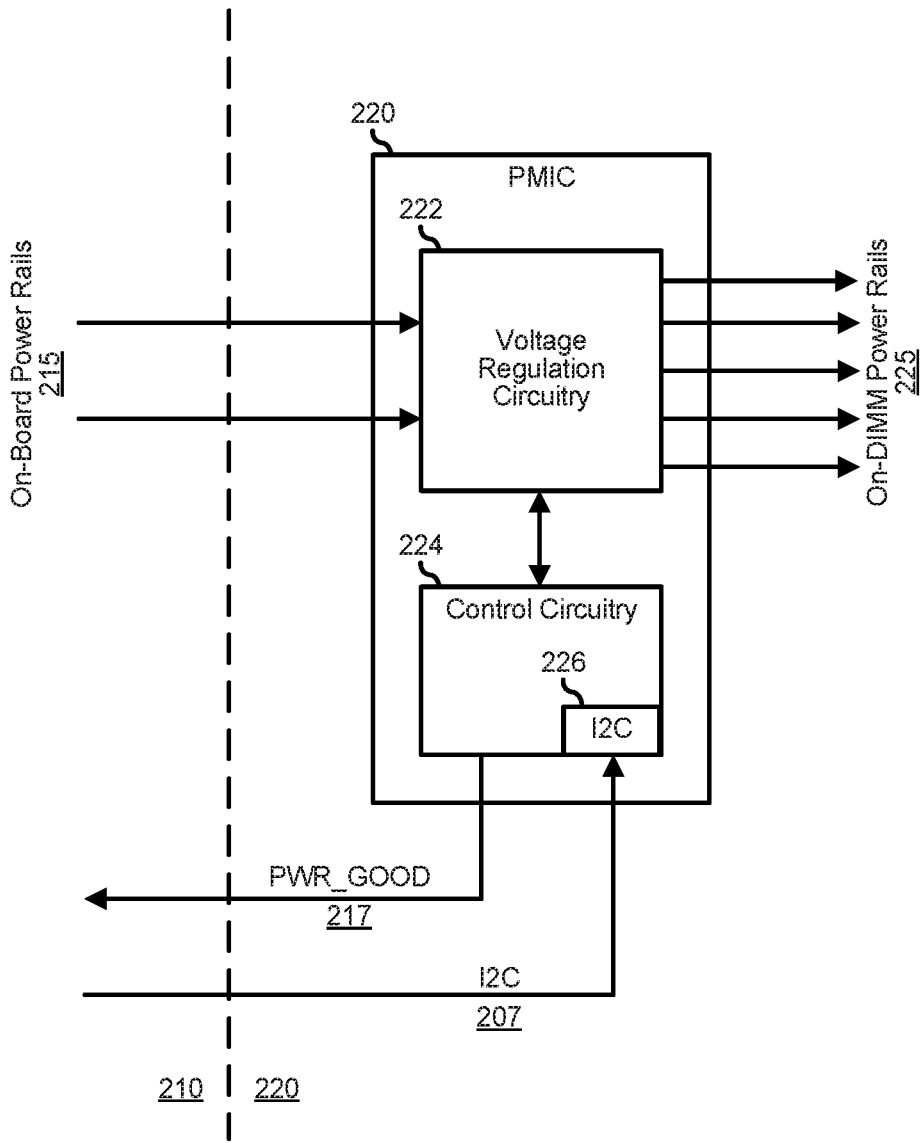
FIG. 2 is a diagram of an information handling system according to another embodiment of the present disclosure.

FIG. 2 illustrates an information handling system 200 similar to information handling system 100. Information handling system 200 includes a main PCB 210 and a DDR5 DIMM 220. DDR5 DIMM 220 includes a PMIC 220. PMIC 220 includes voltage regulation circuitry 222 and control circuitry 224. Control circuitry 224 includes an I2C interface 226. In contrast to previous generations of DDR memory, the DDR5 memory architecture is specified such that each DDR5 DIMM includes a PMIC that provides voltage regulation circuitry to convert the main and auxiliary voltages from the main PCB to the voltage levels needed by the DIMM. As such, voltage regulation circuitry 222 receives onboard power rails 215, that is, the main and auxiliary power rails, from main PCB 210 and converts the voltages from the onboard power rails to the voltages needed by on-DIMM power rails 225. Note that onboard power rails 215 are provided to voltage regulation circuitry 222 as soon as the onboard power rails become energized. However, voltage regulation circuitry 222 does not energize on-DIMM power rails 225 until such time as the voltage regulation circuitry is directed to do so by control circuitry 224. In particular, control circuitry 224 does not direct voltage regulation circuitry 222 to energize on-DIMM power rails 225 until the control circuitry receives a command to power up DDR5 DIMM 220 via I2C interface 226.

When control circuitry 224 receives the command to power up DDR5 DIMM 220 and voltage regulation circuitry 222 energizes on-DIMM power rails 225, the voltage regulation circuitry monitors the health of the on-DIMM power rails. When all of on-DIMM power rails 225 are up and healthy, voltage regulation circuitry 222 informs control circuitry 224 that all of the on-DIMM power rails are healthy, and the control circuitry provides a PWR_GOOD signal to man PCB 210 to indicate that DDR5 DIMM 220 has successfully been powered up. If there are problems detected in energizing on-DIMM power rails 225, voltage regulation circuitry 222 informs control circuitry 224 that there was a problem, and the control circuitry withholds the PWR_GOOD signal to main PCB 210.

Returning to FIG. 1, when information handling system 100 is powered on, DIMMs 120 and 130 receive voltage from the onboard power rails as soon as the onboard power rails become energized. However, DIMMs 120 and 130 will not proceed to power up until CPU 110 directs respective PMICs 122 and 132 to do so via I2C bus 160. The power on sequence of DIMMs on an information may be flexibly enabled based upon the timing of the commands from the CPU to the PMIC. For example, all DIMMs of an information handling system may be directed to be powered up simultaneously, each DIMM may be directed to be powered up at different times, or groups of DIMMs may be directed to be powered up at a first time while other groups of DIMMs may be directed to be powered up at a later time, as needed or desired. Here, when each of DIMMs 120 and 130 are directed to be powered up by CPU 110, the voltage regulation circuitry of respective PMICs 122 and 132 each energize the respective on-DIMM power rails and monitor the health of the respective on-DIMM power rails as described above. When all of on-DIMM power rails of DIMM 120 are up and healthy, PMIC 122 provides a PWR_GOOD signal 162 to CPLD 140. Similarly, when all of on-DIMM power rails of DIMM 130 are up and healthy, PMIC 122 provides a PWR_GOOD signal 164 to CPLD 140. When CPLD 140 receives all of PWR_GOOD signals 162 and 164, the CPLD provides a DRAM_PWROK signal to CPU 110 indicating that all of DIMMs 120 and 130 have been successfully powered up.

In a particular embodiment, BIOS 114 manages the power up sequence for DIMMs 120 and 130, and implements a voltage regulator (VR) time limit to detect that all DIMMs in information handling system 100 have been successfully powered up. Here, a timer measures the amount of time between the issuance of the command to power up DIMMs 120 and 130 on I2C bus 160 by CPU 110, and the time that the CPU receives DRAM_PWROK signal 166. If the time difference exceeds the VR time limit, then BIOS 114 recognizes that at least one of DIMM 120 and 130 have failed to successfully power up. However, it will be understood that, because CPLD 140 only provides DRAM_PWROK signal 166 when all of PWR_GOOD signals 162 and 164 have been received, BIOS 114 is unable to determine whether the failure was on DIMM 120, on DIMM 130, or on both of the DIMMs.

The duration of the VR time limit may be determined based upon the particular DIMMs 120 and 130. Here, during system boot, BIOS 114 may determine information about DIMMs 120 and 140 based upon information stored in a non-volatile media on the DIMMs or in registers within PMICs 122 and 132. The information may include a maximum time between the time that the DIMM receives the command to power up the DIMM on its I2C interface, and the time that the DIMM provides its PWR_GOOD signal. Then, BIOS 114 can determine the duration of the VR time limit as the longest time between receipt of the command to power up the DIMMs and the provision of the associated PWR_GOOD signal, plus a predetermined amount of time for CPLD 140 to issue the DRAM_PWROK signal after receiving all of the DIMM PWR_GOOD signals.

Figure 3:
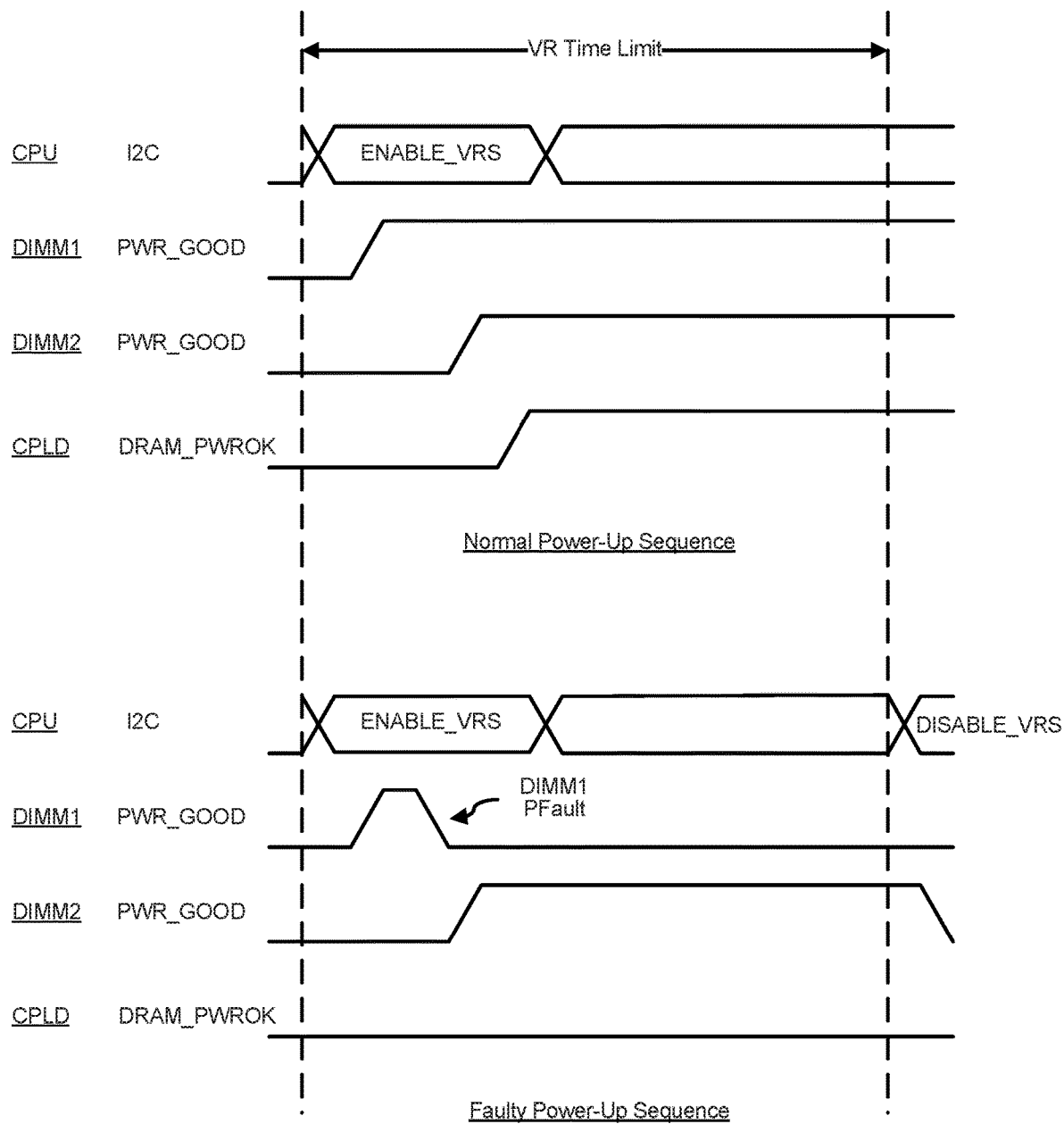
FIG. 3 illustrates timing diagrams for an information handling system according to an embodiment of the present disclosure.

FIG. 3 illustrates timing diagrams for an information handling system similar to information handling system 100. In a first diagram showing a normal power-up sequence is shown where a CPU issues an I2C command to enable the on-DIMM voltage regulators of DIMMs in the information handling system. In response, after a duration of time, the first DIMM issues its PWR_GOOD signal to a CPLD of the information handling system, and a short time later, the second DIMM issues its PWR_GOOD signal to the CPLD. Upon receiving the PWR_GOOD signals from the first and second DIMMS, the CPLD issues a DRAM_PWROK signal to the CPU, indicating that the DIMMs were successfully powered up. Note that the DRAM_PWROK signal is received within a VR time limit. In a second diagram showing a faulty power-up sequence, the CPU issues the I2C command to enable the on-DIMM voltage regulators of the DIMMs. Here, the first DIMM issues its PWR_GOOD signal, but after a short time, a fault is detected on the power rails of the first DIMM, and the PWR_GOOD signal is withdrawn. The second DIMM powers up normally, and issues its PWR_GOOD signal to the CPLD. However, because the CPLD does not receive both of the PWR_GOOD signals at the same time, the CPLD does not issue the DRAM_PWROK signal to the CPU. In response, when the CPU determines that the DRAM_PWROK signal has not been received before the end of the VR time limit, the CPU issues an I2C command to disable the on-DIMM voltage regulators of the DIMMs.

It has been noted that certain types of DIMM power up failures result in extreme exothermic events, such as where a DIMM power rail or device on the DIMM experiences a dead short to ground. In such cases, the lag between the occurrence of the DIMM power up failure and the expiration of the VR time limit and the subsequent issuance of the I2C command to disable the on-DIMM voltage regulators of the DIMMs may be too long to prevent catastrophic failure of the DIMM, the main PCB, or other elements of the information handling system.

Figure 4:
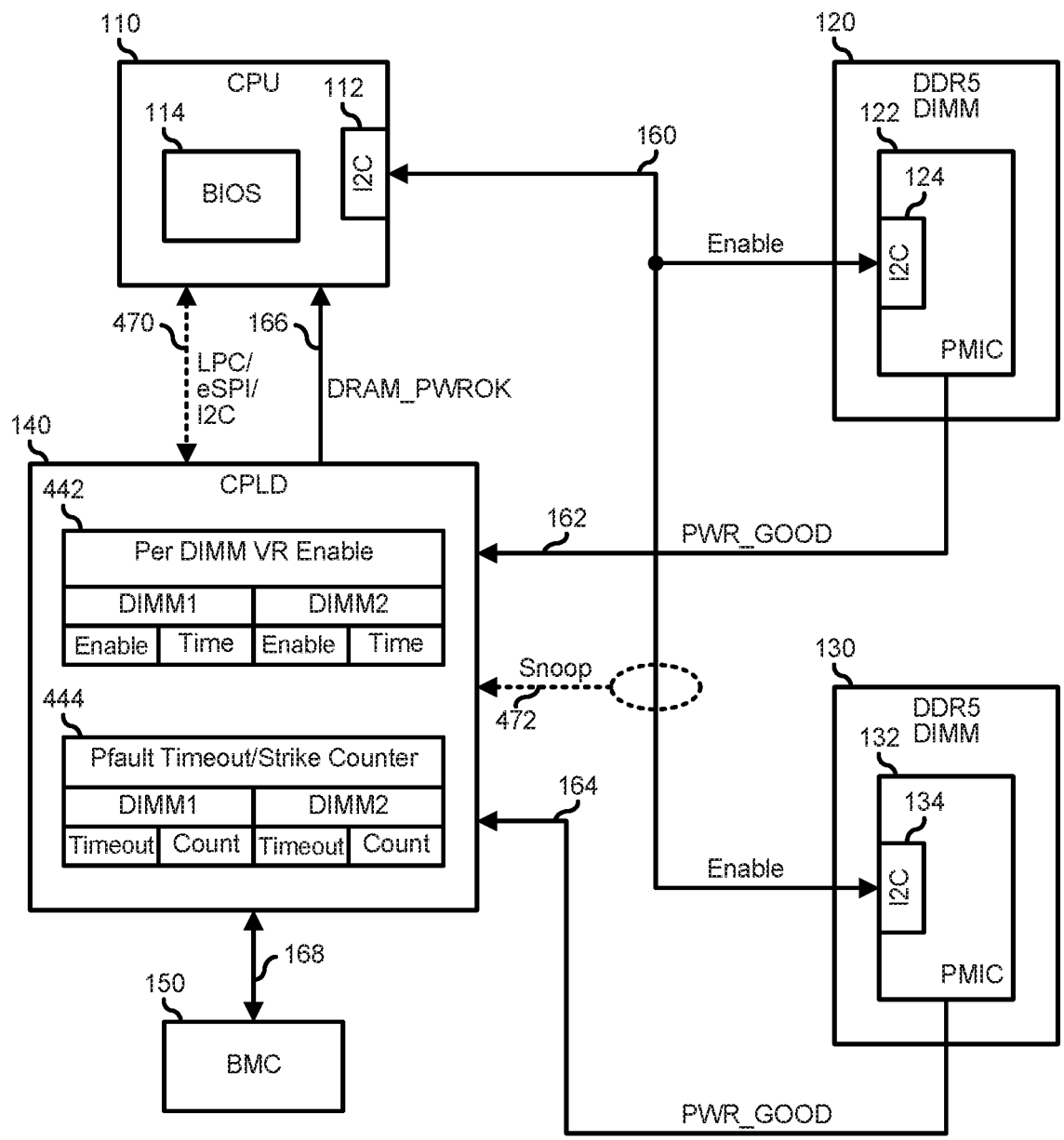
FIG. 4 is a block diagram of the information handling system of FIG. 1.
Figure 5:
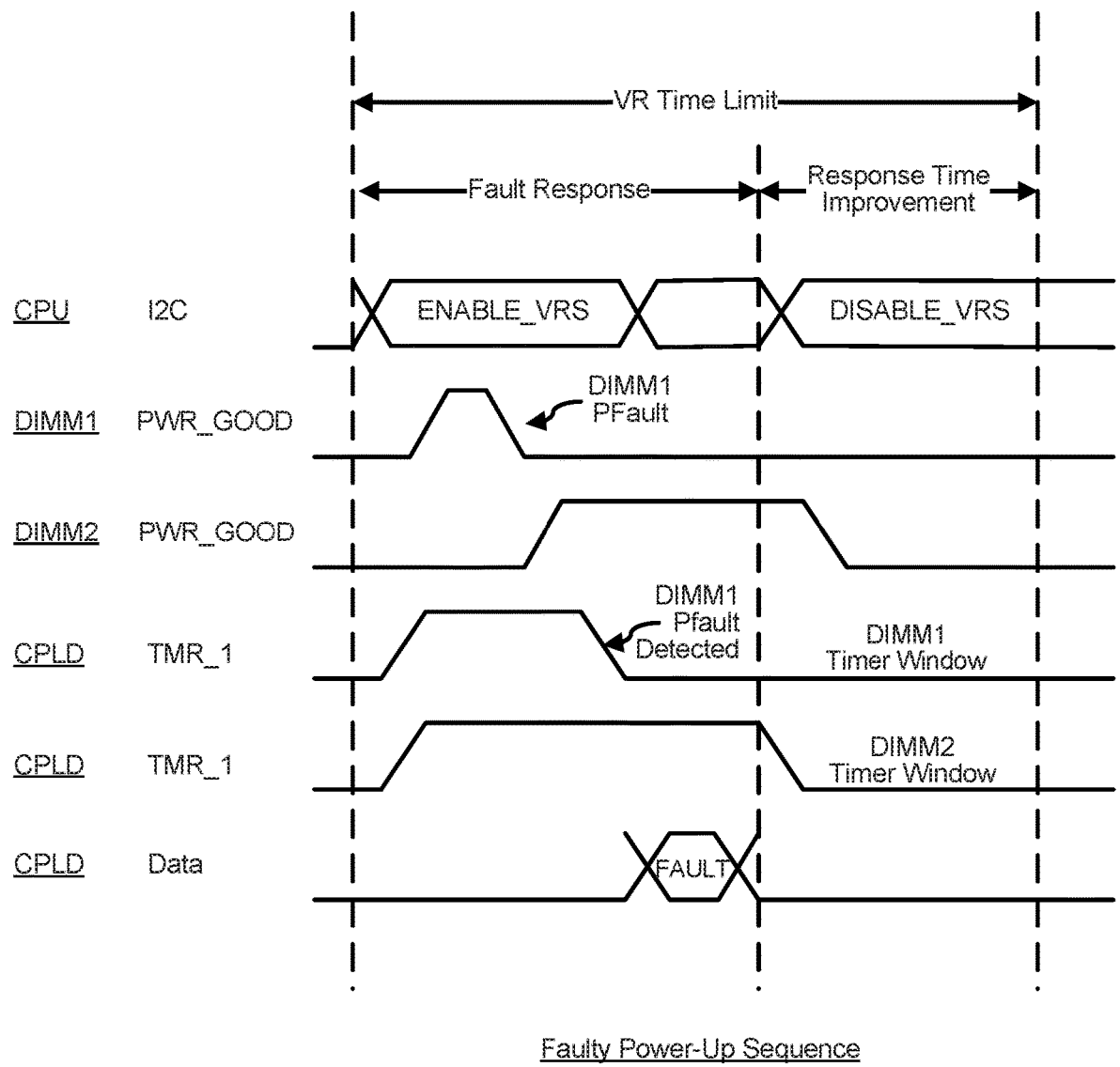
FIG. 5 illustrates timing diagrams for an information handling system according to another embodiment of the present disclosure.

FIG. 4 illustrates information handling system 100, where CPLD 140 includes registers for a per-DIMM VR enable field 442 and a power fault timeout and strike counter module 444. Here, information handling system 100 is illustrated as including a data connection 470 between CPU 110 and CPLD 140, and an I2C sense connection 472 to sense transactions on I2C bus 160. Sense connection 472 is illustrated as being appurtenant to CPLD 140, but this is not necessarily so, and another element of information handling system 100, such as BMC 150, may operate to sense transactions on I2C bus 160 and to provide communications and signals to the CPLD, as needed to perform the functions as described herein.

VR enable field 442 represents a bit field of CPLD 140 that includes at least one bit for each of DIMMs 120 and 130, and all other DIMMs of information handling system 100. Here, when CPU 110 issues a command to enable the voltage regulator on one or more of the DIMMs, CPLD 140 sets the bit in VR enable field 442 that is associated with the commanded DIMMs, and when the CPU issues a command to disable the voltage regulator on one or more of the DIMMs, the CPLD clears the bit in the VR enable field that is associated with the commanded DIMMs. VR enable field 442 may include a timestamp field associated with each bit of the VR enable field. The timestamp includes the time when the associated DIMM was commanded to enable its voltage regulator. Connection 470 represents one or more data communication interfaces on information handling system 100 that provide for communication of data between CPU 110 and CPLD 140, such as one or more of a Low Pin Count (LPC) interface, an Enhanced Serial Peripheral Interface (eSPI), an I2C interface, or the like, as needed or desired. Sense connection 472 represents hooks in CPLD 140 to snoop the transactions on I2C bus 160. In a first case, when CPU 110 issues a command to enable or disable the voltage regulator on a DIMM, the CPU also sends data via data connection 470 to indicate which one of the DIMMs of information handling system 100 have been commanded to enable or disable its voltage regulator, and the CPLD sets or clears the associated bit in VR enable field 442. Here, CPU 110 can also provide timestamp information associated with the command to enable or disable the voltage regulator. In a second case, when CPU 110 issues a command to enable or disable the voltage regulator on a DIMM, CPLD 140 snoops the transaction associated with the command on I2C bus 160 via sense connection on 472, and the CPLD sets or clears the associated bit in VR enable field 442. Here, the CPLD can also derive the associated timestamp from the snooped transaction.

In a particular embodiment, BMC 150 operates to detect the presence of DIMMs 120 and 130 via a SPI interface, and reads information related to the DIMMs from non-volatile storage on each of the DIMMs. Here, BMC 150 operates to obtain information related to a duration of the power up sequence for DIMMs 120 and 130. In particular, each of DIMMs 120 and 130 may be of different types, different capacities, different memory device types, or the like, and thus may each have widely varying time specifications between receiving a command to enable their respective voltage regulators and the issuance of their respective PWR_GOOD signals. BMC 150 operates to receive this timing information for DIMMs 120 and 130. Timeout/counter module 444 includes timeout data fields associated with each DIMM on information handling system 100. Here, BMC 150 further operates to program the timeout data fields with the timing information associated with each DIMM.

For each DIMM in information handling system 100, CPLD 140 operates to compare the associated VR enable field and timestamp with the timing information to determine a timeout for each DIMM. IF CPLD 140 receives the PWR_GOOD signals from all of the DIMMs prior to their respective timeouts, then the CPLD issues the DRAM_PWROK signal to CPU 110, and the boot of information handling system 100 proceeds normally. On the other hand, if one or more DIMM fails to issue its PWR_GOOD signal prior to that DIMMs timeout, CPLD 140 sends a fault indication to CPU 110 via data connection 470 to give the CPU an earlier indication of a power fault in the faulty DIMM than would be available via the VR time limit mechanism, as described above. The power fault indication can also include an identity of the faulty DIMM. In response to receiving the power fault indication, CPU 110 operates to issue a disable command via I2C bus 160 to the faulty DIMM to disable its voltage regulator. In a particular embodiment, when one or more DIMM fails to issue its PWR_GOOD signal prior to that DIMMs timeout, CPLD 140 operates to remove the bulk 12 V power from information handling system 100 to prevent extreme exothermic events due to DIMM power on failures.

Timeout/counter module 444 includes strike counter data fields associated with each DIMM on information handling system 100. Here, when a particular DIMM is detected as having experienced a power fault, CPLD 140 increments the strike counter data field for that DIMM. Then, when the strike counter field for any particular DIMM has a strike count greater than a strike threshold, then CPLD 140 sends a strike indication to CPU 110 via data connection 470 to give the CPU an indication of DIMM that is experiencing repeated power faults. When CPU 110 receives the strike indication for a particular DIMM, the CPU can write to a vendor area of the non-volatile of the particular DIMM, identifying the DIMM as having experienced an excessive number of power faults. Then, on subsequent boots of information handling system 100, CPU 110 can read the vendor area of the non-volatile storage and determine to not initialized that DIMM. In another embodiment, instead of CPU 110 writing to the vendor area of the non-volatile storage of the faulty DIMM, BMC 150 operates to write to the vendor area of the non-volatile storage of the faulty DIMM.

The teachings of the present disclosure are illustrated within the context of DDR5 DIMMs, but this is not necessarily so, and the teachings of the present disclosure may be applied to other memory architectures that provide for separate voltage regulation and power-on sequencing as described herein without violating the teachings of the present disclosure.

Figure 6:
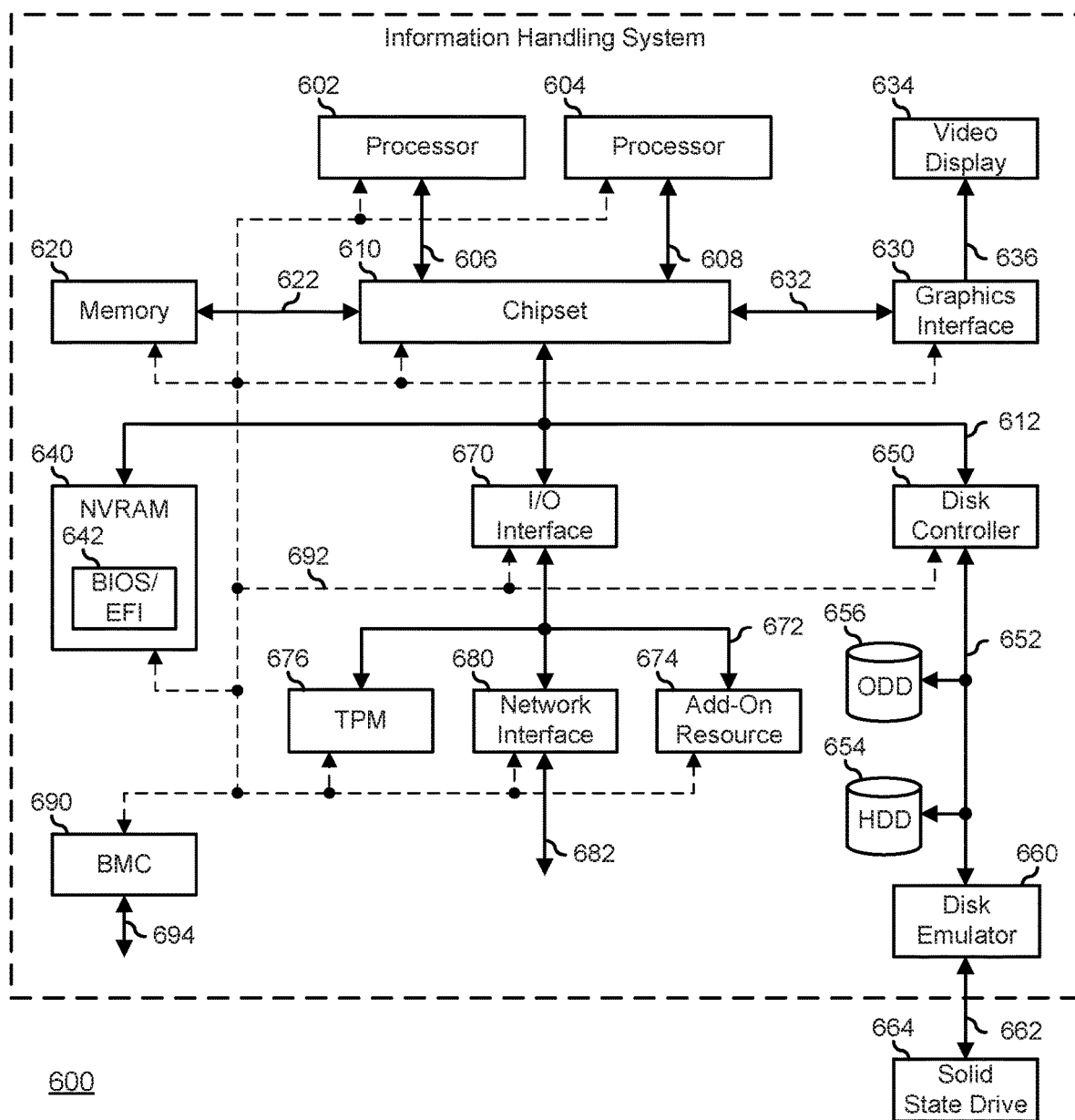
FIG. 6 is a block diagram of a general information handling system according to at least one embodiment of the disclosure.

FIG. 6 illustrates a generalized embodiment of information handling system 600. For purpose of this disclosure information handling system 600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 includes processors 602 and 604, a chipset 610, a memory 620, a graphics adapter 630 connected to a video display 634, a non-volatile RAM (NV-RAM) 640 that includes a basic input and output system/extensible firmware interface (BIOS/EFI) module 642, a disk controller 650, a hard disk drive (HDD) 654, an optical disk drive 656, a disk emulator 660 connected to a solid state drive (SSD) 664, an input/output (I/O) interface 670 connected to an add-on resource 674 and a trusted platform module (TPM 676, a network interface 680, and a baseboard management controller (BMC) 690. Processor 602 is connected to chipset 610 via processor interface 606, and processor 604 is connected to the chipset via processor interface 608. In a particular embodiment, processors 602 and 604 are connected together via a high-capacity coherent fabric, such as a HyperTransport link, a QuickPath Interconnect, or the like. Chipset 610 represents an integrated circuit or group of integrated circuits that manages the data flows between processors 602 and 604 and the other elements of information handling system 600. In a particular embodiment, chipset 610 represents a pair of integrated circuits, such as a northbridge component and a southbridge component. In another embodiment, some or all of the functions and features of chipset 610 are integrated with one or more of processors 602 and 604. Memory 620 is connected to chipset 610 via a memory interface 622. An example of memory interface 622 includes a Double Data Rate (DDR) memory channel and memory 620 represents one or more DDR Dual In-Line Memory Modules (DIMMs). In a particular embodiment, memory interface 622 represents two or more DDR channels. In another embodiment, one or more of processors 602 and 604 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 620 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 630 is connected to chipset 610 via a graphics interface 632, and provides a video display output 636 to a video display 634. An example of a graphics interface 632 includes a Peripheral Component Interconnect-Express (PCIe) interface and graphics adapter 630 can include a four lane (×4) PCIe adapter, an eight lane (×8) PCIe adapter, a 16-lane (×16) PCIe adapter, or another configuration, as needed or desired. In a particular embodiment, graphics adapter 630 is provided down on a system printed circuit board (PCB). Video display output 636 can include a Digital Video Interface (DVI), a High-Definition Multimedia Interface (HDMI), a DisplayPort interface, or the like, and video display 634 can include a monitor, a smart television, an embedded display such as a laptop computer display, or the like.

NV-RAM 640, disk controller 650, and I/O interface 670 are connected to chipset 610 via an I/O channel 612. An example of I/O channel 612 includes one or more point-to-point PCIe links between chipset 610 and each of NV-RAM 640, disk controller 650, and I/O interface 670. Chipset 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 640 includes BIOS/EFI module 642 that stores machine-executable code (BIOS/EFI code) that operates to detect the resources of information handling system 600, to provide drivers for the resources, to initialize the resources, and to provide common access mechanisms for the resources. The functions and features of BIOS/EFI module 642 will be further described below.

Disk controller 650 includes a disk interface 652 that connects the disc controller to a hard disk drive (HDD) 654, to an optical disk drive (ODD) 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits a solid-state drive (SSD) 664 to be connected to information handling system 600 via an external interface 662. An example of external interface 662 includes a USB interface, a proprietary interface, or a combination thereof. Alternatively, solid-state drive 664 can be disposed within information handling system 600.

I/O interface 670 includes a peripheral interface 672 that connects the I/O interface to add-on resource 674, to TPM 676, and to network interface 680. Peripheral interface 672 can be the same type of interface as I/O channel 612, or can be a different type of interface. As such, I/O interface 670 extends the capacity of I/O channel 612 when peripheral interface 672 and the I/O channel are of the same type, and the I/O interface translates information from a format suitable to the I/O channel to a format suitable to the peripheral channel 672 when they are of a different type. Add-on resource 674 can include a data storage system, an additional graphics interface, a network interface card (NIC), a sound/ video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a network communication device disposed within information handling system 600, on a main circuit board of the information handling system, integrated onto another component such as chipset 610, in another suitable location, or a combination thereof. Network interface device 680 includes a network channel 682 that provides an interface to devices that are external to information handling system 600. In a particular embodiment, network channel 682 is of a different type than peripheral channel 672 and network interface 680 translates information from a format suitable to the peripheral channel to a format suitable to external devices. In a particular embodiment, network interface 680 includes a network interface card (NIC) or host bus adapter (HBA), and an example of network channel 682 includes an InfiniBand channel, a Fibre Channel, a Gigabit Ethernet channel, a proprietary channel architecture, or a combination thereof. In another embodiment, network interface 680 includes a wireless communication interface, and network channel 682 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 682 can be connected to an external network resource (not illustrated). The network resource can include another information handling system, a data storage system, another network, a grid management system, another suitable resource, or a combination thereof.

BMC 690 is connected to multiple elements of information handling system 600 via one or more management interface 692 to provide out of band monitoring, maintenance, and control of the elements of the information handling system. As such, BMC 690 represents a processing device different from processor 602 and processor 604, which provides various management functions for information handling system 600. For example, BMC 690 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers.

Capabilities and functions provided by BMC 690 can vary considerably based on the type of information handling system. BMC 690 can operate in accordance with an Intelligent Platform Management Interface (IPMI). Examples of BMC 690 include an Integrated Dell Remote Access Controller (iDRAC). Management interface 692 represents one or more out-of-band communication interfaces between BMC 690 and the elements of the information handling system 600, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 600, that is apart from the execution of code by processors 602 and 604 and procedures that are implemented on the information handling system in response to the executed code. BMC 690 operates to monitor and maintain system firmware, such as code stored in BIOS/EFI module 642, option ROMs for graphics interface 630, disk controller 650, add-on resource 674, network interface 680, or other elements of information handling system 600, as needed or desired. In particular, BMC 690 includes a network interface 694 that can be connected to a remote management system to receive firmware updates, as needed or desired. Here, BMC 690 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 690 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 690, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 690 is included on a main circuit board (such as a baseboard, a motherboard, or any combination thereof) of information handling system 600, or is integrated onto another element of the information handling system such as chipset 610, or another suitable element, as needed or desired. As such, BMC 690 can be part of an integrated circuit or a chip set within information handling system 600. An example of BMC 690 includes an integrated Dell remote access controller (iDRAC), or the like. BMC 690 may operate on a separate power plane from other resources in information handling system 600. Thus BMC 690 can communicate with the management system via network interface 694 while the resources of information handling system 600 are powered off. Here, information can be sent from the management system to BMC 690 and the information can be stored in a RAM or NV-RAM associated with the BMC. Information stored in the RAM may be lost after power-down of the power plane for BMC 690, while information stored in the NV-RAM may be saved through a power-down/power-up cycle of the power plane for the BMC.

The term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
    a processor;
    a logic device; and
    a first memory device including a first voltage regulator configured to be enabled by a first command from the processor, the first memory device configured to provide a first indication to the logic device that the first voltage regulator successfully powered up the first memory device, wherein a failure to provide the first indication within a first time duration indicates that the first voltage regulator failed to successfully power up the first memory device;
    wherein the logic device is configured to:
        determine that the processor issued the first command;
        send a second indication to the processor indicating that the first voltage regulator successfully powered up the first memory device when the first indication is received within the first time duration after determining that the processor issued the first command; and
        send a third indication to the processor that the first voltage regulator failed to successfully power up the first memory device when the first indication is not received within the first time duration after determining that the processor issued the first command.

2. The information handling system of claim 1, further comprising:
    a second memory device including a second voltage regulator configured to be enabled by a second command from the processor, the second memory device configured to provide a fourth indication to the logic device that the second voltage regulator successfully powered up the second memory device, wherein a failure to provide the fourth indication within a second time duration indicates that the second voltage regulator failed to successfully power up the second memory device;
    wherein the logic device is further configured to:
        determine that the processor issued the second command, wherein the second indication further indicates that the second voltage regulator successfully powered up the second memory device when the fourth indication is received within the second time duration after determining that the processor issued the second command; and
        send a fifth indication to the processor that the second voltage regulator failed to successfully power up the second memory device when the fourth indication is not received within the second time duration after determining that the processor issued the second command.

3. The information handling system of claim 2, wherein the logic device includes voltage enable bit fields associated with each of the first and second memory devices, each voltage enable bit field including:
    a first bit field to indicate that an associated DIMM has been directed to be powered up; and
    a second bit field to include a time stamp of when the associated DIMM was directed to be powered up.

4. The information handling system of claim 3, wherein the logic device further includes a first timeout bit field that stores the first time duration, and a second timeout bit field that stores the second time duration.

5. The information handling system of claim 1, wherein the first command is issued from the processor to the first memory device via a first communication interface.

6. The information handling system of claim 5, wherein, in determining that the processor issued the first command, the logic device is further configured to snoop transactions on the first communication interface to detect the first command.

7. The information handling system of claim 5, wherein the first communication interface is a first Inter-Integrated Circuit (I2C) interface.

8. The information handling system of claim 6, wherein, in determining that the processor issued the first command, the logic device is further configured to receive data from the processor via a second communication interface, the data including information indicating that the processor issued the first command.

9. The information handling system of claim 8, wherein the second communication interface is one of a Low Pin Count (LPC) interface, an Enhances Serial Peripheral Interface (eSPI), and a second I2C interface.

10. The information handling system of claim 1, wherein the first memory device is a Double Data Rate-5 (DDR5) Dual In-Line Memory Module (DIMM).

11. A method, comprising:
 determining, by a logic device of an information handling system, that a processor of the information handling system issued a first command to a first memory device, the first command directing a first voltage regulator of the first memory device to be enabled, the first memory device configured to provide a first indication to the logic device that the first voltage regulator successfully powered up the first memory device, wherein a failure to provide the first indication within a first time duration indicates that the first voltage regulator failed to successfully power up the first memory device;
 sending, by the logic device, a second indication to the processor indicating that the first voltage regulator successfully powered up the first memory device when the first indication is received within the first time duration after determining that the processor issued the first command; and
 sending a third indication to the processor that the first voltage regulator failed to successfully power up the first memory device when the first indication is not received within the first time duration after determining that the processor issued the first command.

12. The method of claim 11, further comprising:
 determining, by the logic device, that the processor issued a second command to a second memory device, the second command directing a second voltage regulator of the second memory device to be enabled, the second memory device configured to provide a fourth indication to the logic device that the second voltage regulator successfully powered up the second memory device, wherein a failure to provide the fourth indication within a second time duration indicates that the second voltage regulator failed to successfully power up the second memory device;
 determining, by the logic device, that the processor issued the second command, wherein the second indication further indicates that the second voltage regulator successfully powered up the second memory device when the fourth indication is received within the second time duration after determining that the processor issued the second command; and
 sending, by the logic device, a fifth indication to the processor that the second voltage regulator failed to successfully power up the second memory device when the fourth indication is not received within the second time duration after determining that the processor issued the second command.

13. The method of claim 12, wherein the logic device includes voltage enable bit fields associated with each of the first and second memory devices, each voltage enable bit field including:
 a first bit field to indicate that an associated DIMM has been directed to be powered up; and
 a second bit field to include a time stamp of when the associated DIMM was directed to be powered up.

14. The method of claim 13, wherein the logic device further includes a first timeout bit field that stores the first time duration, and a second timeout bit field that stores the second time duration.

15. The method of claim 11, wherein the first command is issued from the processor to the first memory device via a first communication interface.

16. The method of claim 15, wherein, in determining that the processor issued the first command, the logic device is configured to snoop transactions on the first communication interface to detect the first command.

17. The method of claim 15, wherein the first communication interface is a first Inter-Integrated Circuit (I2C) interface.

18. The method of claim 16, wherein, in determining that the processor issued the first command, the logic device is further configured to receive data from the processor via a second communication interface, the data including information indicating that the processor issued the first command.

19. The method of claim 18, wherein the second communication interface is one of a Low Pin Count (LPC) interface, an Enhances Serial Peripheral Interface (eSPI), and a second I2C interface.

20. An information handling system, comprising:
 a first Double Data Rate-5 (DDR5) Dual In-Line Memory Module (DIMM) including a first voltage regulator configured to be enabled by a first command from a processor, the first DDR5 DIMM configured to provide a first indication to a logic device that the first voltage regulator successfully powered up the first DDR5 DIMM, wherein a failure to provide the first indication within a first time duration indicates that the first voltage regulator failed to successfully power up the first DDR5 DIMM; and
 a second DDR5 DIMM including a second voltage regulator configured to be enabled by a second command from the processor, the second DDR5 DIMM configured to provide a fourth indication to the logic device that the second voltage regulator successfully powered up the second DDR5 DIMM, wherein a failure to provide the fourth indication within a second time duration indicates that the second voltage regulator failed to successfully power up the second DDR5 DIMM;
 wherein the logic device is configured to:
  determine that the processor issued the first command;
  determine that the processor issued the second command;
  send a second indication to the processor indicating that the first voltage regulator successfully powered up the first DDR5 DIMM and that the second voltage regulator successfully powered up the second DDR5 DIMM when both the first indication is received within the first time duration after determining that the processor issued the first command and the second indication is received within the first time duration after determining that the processor issued the second command; and send a third indication to the processor that at least one of the first voltage regulator failed to successfully power up the first DDR5 DIMM when the first indication is not received within the first time duration after determining that the processor issued the first command and that the second voltage regulator failed to successfully power up the second DDR5 DIMM when the second indication is not received within the second time duration after determining that the processor issued the second command.

* * * * *